(12) United States Patent
Wu et al.

(10) Patent No.: US 10,763,338 B2
(45) Date of Patent: Sep. 1, 2020

(54) SILICIDE IMPLANTS

(71) Applicant: Taiwan Semiconductor Manufacturing Co., Ltd., Hsinchu (TW)

(72) Inventors: Chia-Yang Wu, Tainan (TW); Shiu-Ko Jang-Jian, Tainan (TW); Ting-Chun Wang, Tainan (TW); Chuan-Pu Liu, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/690,693

(22) Filed: Aug. 30, 2017

(65) Prior Publication Data

US 2019/0067436 A1 Feb. 28, 2019

(51) Int. Cl.
*H01L 29/45* (2006.01)
*H01L 29/66* (2006.01)
*H01L 21/768* (2006.01)
*H01L 21/326* (2006.01)
*H01L 21/285* (2006.01)
(Continued)

(52) U.S. Cl.
CPC ........ *H01L 29/45* (2013.01); *H01L 21/28518* (2013.01); *H01L 21/326* (2013.01); *H01L 21/76802* (2013.01); *H01L 21/76879* (2013.01); *H01L 21/76886* (2013.01); *H01L 21/76889* (2013.01); *H01L 29/0847* (2013.01); *H01L 29/165* (2013.01); *H01L 29/41791* (2013.01); *H01L 29/456* (2013.01); *H01L 29/665* (2013.01); *H01L 29/66636* (2013.01); *H01L 29/66795* (2013.01); *H01L 29/7848* (2013.01); *H01L 29/7851* (2013.01); *H01L 21/0245* (2013.01); *H01L 21/0262* (2013.01); *H01L 21/02532* (2013.01); *H01L 21/02579* (2013.01); *H01L 21/76846* (2013.01)

(58) Field of Classification Search
None
See application file for complete search history.

(56) References Cited

U.S. PATENT DOCUMENTS 7,618,883 B2 * 11/2009 Sasaki .................. H01L 21/223
  438/528
7,696,072 B2 * 4/2010 Sasaki .................. H01L 21/223
  438/513

(Continued)

*Primary Examiner* — Telly D Green
(74) *Attorney, Agent, or Firm* — Sterne, Kessler, Goldstein & Fox P.L.L.C.

(57) ABSTRACT

The present disclosure describes a silicide formation process which employs the formation of an amorphous layer in the SiGe S/D region via an application of a substrate bias voltage during a metal deposition process. For example, the method includes a substrate with a gate structure disposed thereon and a source/drain region adjacent to the gate structure. A dielectric is formed over the gate structure and the source-drain region. A contact opening is formed in the dielectric to expose a portion of the gate structure and a portion of the source/drain region. An amorphous layer is formed in the exposed portion of the source/drain region with a thickness and a composition which is based on an adjustable bias voltage applied to the substrate. Further, an anneal is performed to form a silicide on the source/drain region.

20 Claims, 7 Drawing Sheets

(51) Int. Cl.
  *H01L 29/78* (2006.01)
  *H01L 29/417* (2006.01)
  *H01L 29/165* (2006.01)
  *H01L 29/08* (2006.01)
  *H01L 21/02* (2006.01)

(56) References Cited

U.S. PATENT DOCUMENTS

| | | | | |
|---|---|---|---|---|
| 7,709,362 | B2 * | 5/2010 | Sasaki | H01L 21/223 |
| | | | | 438/513 |
| 7,741,199 | B2 * | 6/2010 | Sasaki | H01L 21/223 |
| | | | | 438/513 |
| 8,222,128 | B2 * | 7/2012 | Sasaki | H01L 21/223 |
| | | | | 438/510 |
| 9,324,830 | B2 * | 4/2016 | He | H01L 29/7851 |
| 9,634,117 | B2 * | 4/2017 | He | H01L 29/7851 |
| 9,673,101 | B2 * | 6/2017 | Ok | H01L 21/823475 |
| 2002/0185691 | A1 * | 12/2002 | Cabral, Jr. | H01L 21/26506 |
| | | | | 257/384 |
| 2009/0218693 | A1 * | 9/2009 | Lee | H01L 21/76843 |
| | | | | 257/751 |
| 2010/0052071 | A1 * | 3/2010 | Niimi | H01L 21/823842 |
| | | | | 257/369 |
| 2011/0062501 | A1 * | 3/2011 | Soss | H01L 21/28114 |
| | | | | 257/288 |
| 2011/0298017 | A1 * | 12/2011 | Jain | H01L 21/76897 |
| | | | | 257/288 |
| 2011/0298061 | A1 * | 12/2011 | Siddiqui | H01L 21/28088 |
| | | | | 257/410 |
| 2013/0001555 | A1 * | 1/2013 | Yin | H01L 21/28518 |
| | | | | 257/52 |
| 2013/0249099 | A1 * | 9/2013 | Lavoie | H01L 29/665 |
| | | | | 257/769 |
| 2015/0311150 | A1 * | 10/2015 | Lin | H01L 23/53238 |
| | | | | 257/751 |
| 2015/0372142 | A1 * | 12/2015 | Kuang | H01L 29/7848 |
| | | | | 257/192 |
| 2017/0207095 | A1 * | 7/2017 | Lee | H01L 21/28518 |
| 2018/0323107 | A1 * | 11/2018 | Zhou | H01L 21/823431 |
| 2019/0067114 | A1 * | 2/2019 | Liu | H01L 21/823431 |

* cited by examiner

SILICIDE IMPLANTS

BACKGROUND

In integrated circuit (IC) fabrication, silicides can be formed between a metal contact and a silicon junction, such as the source/drain regions of a transistor. A silicide can improve the contact resistance in a transistor by reducing residual oxides at the silicon interface during the silicide formation. Silicide formation temperatures can depend on the desired phase of the silicide material.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
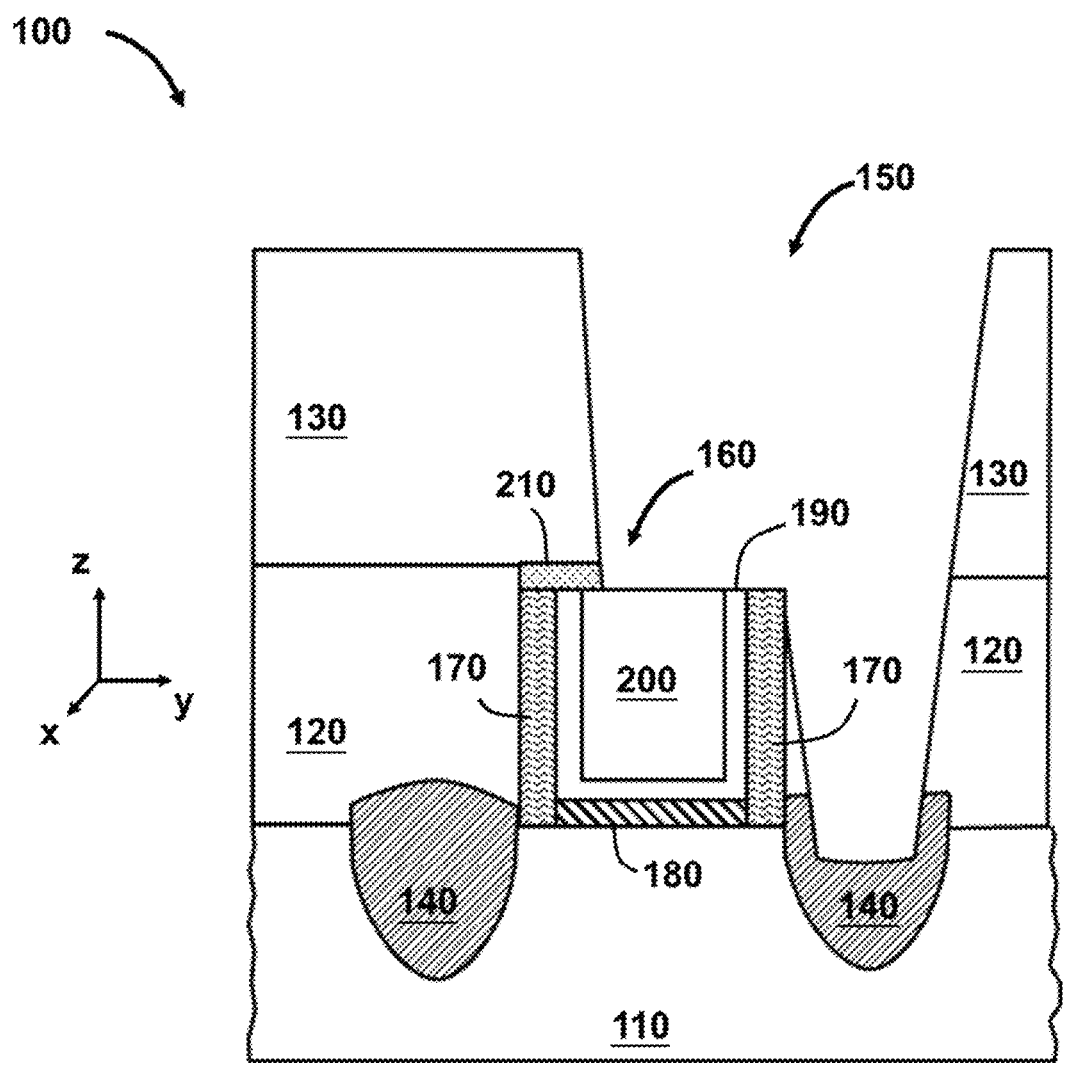
FIG. 1 is a cross-section of a contact opening that exposes a portion of a gate structure and a portion of a source/drain contact in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

A silicide is a metal compound that can provide low electrical resistivity (e.g., 13-70 µΩ-cm) between a metal contact and a doped silicon region of a transistor, e.g., a source/drain region. By way of example and not limitation, silicides that can be used in IC manufacturing include titanium silicide ($TiSi_2$), nickel platinum silicide (NiPtSi), cobalt silicide ($CoSi_2$), tungsten silicide ($WSi_2$), tantalum silicide ($TaSi_2$), and molybdenum silicide ($MoSi_2$).

A silicide can be formed, for example, by depositing an appropriate metal (e.g., a refractory metal) such as titanium, nickel, cobalt, tungsten, tantalum or molybdenum, on a surface of a silicon wafer and subsequently annealing the wafer at, or above, the silicide formation temperature. The silicide formation temperatures can depend on the silicide material and may range from about 550° C. to about 1100° C. In areas where silicon is exposed, the metal can react with silicon to form a silicide. In other areas of the wafer where no silicon is present (e.g., where silicon is covered with oxides, nitride layers, or metals), there is little or no silicide formation. After the silicide formation, the "unreacted" metal can be removed, if required, with a wet etch process. Additional metals may be used to form silicides with a stable, low-resistance phase (e.g., grain structure). In addition, the annealing conditions (e.g., annealing temperature, annealing time, and method of heating) can influence the silicide's thickness, composition and phase (grain structure). Some silicides may require more than one annealing step to achieve a low resistance phase.

In p-type S/D contacts, where silicon-germanium (SiGe) epitaxial material is used, a germanium (Ge) rich layer may be formed between the S/D contact and the silicide during the silicide formation. The Ge-rich layer may lead to Ge-containing "extrusions" which can result in electrical shorts between the S/D regions and a neighboring gate structure.

The present disclosure is directed to an in-situ process that can form a thin metallic amorphous layer (e.g., between about 3 nm and about 8 nm) in the top surface of the transistor's SiGe S/D region. This amorphous layer may suppress the formation of the Ge-rich layer during the silicide formation and limit or eliminate the formation of Ge-containing extrusions.

FIG. 1 is a cross-section of an exemplary structure 100 that includes a substrate 110, a gate structure 160, a pair of S/D regions 140, dielectrics 120 and 130, and a contact opening 150. In some embodiments, contact opening 150 can be a "shared" opening between gate structure 160 and one of the S/D regions 140. In some embodiments, contact opening 150 can be a contact opening that exposes S/D region 140 (e.g., that only exposes S/D region 140), e.g., a single contact. In the 3-dimensional space, contact opening 150 is a feature that can be considered a trench in dielectrics 120 and 130 along the x-axis.

In some embodiments, exemplary substrate 100 can be a bulk semiconductor wafer or the top layer of a semiconductor on insulator (SOI) wafer. Alternatively, substrate 100 can be a fin (e.g., in y-direction) that is perpendicular to a wafer's top surface. By way of example and not limitation, substrate 100 can be made of silicon or another elementary semiconductor such as, for example, germanium.

In some embodiments, S/D region 140 can be a p-type epitaxially grown SiGe stack. The SiGe stack may include two or more epitaxial layers which can be grown in succession and feature different germanium (Ge) atomic percentages (atomic %) and B dopant concentrations. By way of example and not limitation, the first layer can have a Ge atomic % that ranges from 0 to about 40%, and a B dopant concentration that ranges from about $5\times10^{19}$ atoms/cm$^3$ to about $1\times10^{20}$ atoms/cm$^3$. The second epitaxial layer can have a Ge atomic % that ranges from about 20% to about 80%, and a B dopant concentration that ranges from about $3\times10^{20}$ atoms/cm$^3$ to about $5\times10^{21}$ atoms/cm$^3$. Finally, the third epitaxial layer is a capping layer that can have similar Ge atomic % and B dopant concentrations as the first layer (e.g., 0 to about 40% for Ge, and about $5\times10^{19}$ atoms/cm$^3$ to about $1\times10^{21}$ atoms/cm$^3$ for B dopant). The thickness of these layers can vary depending on the device performance requirements. For example, the first epitaxial layer can have a thickness range between about 10 nm and about 20 nm, the second epitaxial layer can have a thickness range between about 30 nm to about 60 nm, and the third epitaxial layer (capping layer) can have a thickness range between 0 nm and about 10 nm. In some embodiments, the SiGe epitaxial growth process can be performed at high temperatures ranging from about 450° C. to about 740° C. During the epitaxial growth, the process pressure can range between 1 to 100 Torr, and the reactant gasses may include a silane ($SiH_4$), disilane ($Si_2H_6$), germane ($GeH_4$), diborane ($B_2H_6$), hydrochloric acid (HCl), in which one or more of these reactant gases can be combined with hydrogen ($H_2$), nitrogen ($N_2$), or argon (Ar). The aforementioned ranges and types of gasses are exemplary and are not intended to be limiting.

In some embodiments, dielectrics 120 and 130 can be made of $SiO_2$, carbon-doped silicon oxide ($SiO_xC$), silicon oxy-nitride (SiON), silicon-oxy-carbon nitride (SiOCN), silicon carbide (SiC), or silicon carbon nitride (SiCN). Dielectrics 120 and 130 are also known as "interlayer dielectric (ILD) layers." Dielectrics 120 and 130 can provide electrical isolation between gate structure 160 and the metal contacts that will be formed adjacent to gate structure 160. Dielectrics 120 and 130 can be deposited with CVD, flowable CVD, physical vapor deposition (PVD), or can be thermally grown.

Gate structure 160 can be a multilayer stack structure which may include an interfacial layer (IL) 180, a high-k dielectric 190, a multiple gate (MPG) metal stack 200, and a pair of opposing spacers 170.

IL 180 can be a native oxide, such as silicon oxide ($SiO_2$) with a thickness ranging from about 20 Å to about 30 Å. High-k dielectric 190 can be deposited by atomic layer deposition (ALD) and its thickness can range from about 10 Å to about 20 Å. In some embodiments, the high-k dielectric can be hafnium oxide ($HfO_2$), a hafnium silicate-based material, or another suitable dielectric material with dielectric constant (k-value) greater than 3.9—which is the dielectric constant of $SiO_2$ and is used as an example reference.

MPG metal stack 200 can include a capping layer for high-k dielectric 190, one or more metallic layers, a work function metal (WFM) stack and a metal fill layer. For simplicity, the capping layer, the one or more metallic layers, the WFM stack and the metal fill layer are not individually depicted within MPG metal stack 200 of FIG. 1. In some embodiments, the capping layer for high-k dielectric 190 can be deposited with ALD. ALD is a deposition method that can provide controlled and conformal layer growth at an angstrom level. In some embodiments, the capping layer for high-k dielectric 190 can have a thickness that ranges from about 5 Å to about 15 Å. The capping layer for high-k dielectric 190 is used to protect high-k dielectric 190 from subsequent processing operations—e.g., the formation of the one or more metallic layers of MPG stack 200. In some embodiments, the capping layer for high-k dielectric 190 is a Ti-based material.

The number and type of metallic layers in MPG stack 200 may depend on the transistor's threshold voltage requirements. Exemplary metallic layers in MPG stack 200 may include a tantalum nitride (TaN) bottom layer and one or more titanium nitride (TiN) layers. In some embodiments, the TaN bottom layer is deposited with chemical vapor deposition (CVD). By way of example and not limitation, the thickness of the TaN bottom layer can range from about 10 Å to about 15 Å. In some embodiments, the one or more TiN layers can be formed with an ALD or a diffusion process. The TiN layers deposited with an ALD process can have a thickness between about 8 Å and about 12 Å, while the TiN layers deposited with a diffusion process can be thicker, e.g., with a thickness ranging from about 12 Å to about 50 Å.

In some embodiments, the WFM stack can include titanium/aluminum (Ti/Al) bi-layers or a Ti—Al alloy, both of which can be deposited with an ALD process. By way of example and not limitation, the WFM stack can have a thickness range between about 20 Å and about 35 Å. The WFM stack can fine tune the work function of the metal gate electrode and influence the threshold voltage of the transistor. The thickness and the number of the one or more TiN layers, in combination with the WFM stack, can set the transistor's threshold voltage.

In some embodiments, metal fill layer can include a TiN barrier layer and a tungsten (W) metal stack. The TiN barrier layer, which can be deposited with an ALD process, can protect the underlying WFM stack from the fluorine chemistry used during the deposition of the W metal stack. According to some embodiments, the thickness of the TiN barrier layer can be between about 40 Å and about 50 Å. A nitride etch stop layer 210 is formed to protect MPG metal stack 200 during the formation of shared contact opening 150. In some embodiments, nitride etch stop layer 210 is silicon nitride ($Si_xN_y$)

In some embodiments, spacers 170 can be made of a dielectric material, such as $SiO_2$, silicon oxynitride (SiON), carbon-doped silicon nitride (SiCN), silicon oxycarbide ($SiO_xC_y$), or $Si_xN_y$. In some embodiments, the thickness of spacers 170 can range from about 2 nm to about 5 nm. Spacers 170 can be a stack of one or more layers made of the same or different materials. In some embodiments, spacers 170 can be used as alignment masks during the formation of the transistor's S/D regions 140.

Contact opening 150 can be formed by patterning dielectrics 120 and 130 using photolithography and etch processes. By way of example and not limitation, contact opening 150 can be formed in a single or a dual-operation process. For instance, in a single-operation process, a coat of photoresist can be applied on dielectric 130. The photoresist can be exposed and developed according to a desired pattern; for example, a desired pattern could be openings in dielectrics 130 and 120 to expose at least a portion of gate structure 160 and at least a portion of the S/D region 140. The unexposed areas of the photoresist can be stripped with a wet or dry etch process to leave the desired pattern of developed photoresist on dielectric 130. A dry etch process can be used, for example, to remove exposed areas of dielectric 130. Areas of dielectric 130 covered by the developed photoresist can be protected from the etch chemistry of the dry etch process and therefore not etched. The etch process can be anisotropic so that the sidewalls of contact opening 150 can be substantially vertical, greater than 80° (e.g., 87°). By way of example and not limitation, a dry etch chemistry can include a mixture of carbon fluoride gases ($CF_x$). Nitride etch stop layer 210 can protect gate stack 160 during the etch process and while dielectric 120 is being etched. The etch process may also etch part of spacer 170, however the selectivity towards dielectric 120 can be much higher (e.g., greater than 5:1) and therefore dielectric 120 will be etched faster. The etch process may be end-pointed when S/D region 140 is exposed.

Alternatively, a dual-step process may utilize two photolithography and two etch operations. For example, during the first operation, a first photolithography and a first etch operation can form a first contact opening that exposes a portion of gate structure 160; and a second photolithography and second etch operation can form a second contact opening that is partially shifted compared to the first opening and can expose a portion of S/D region 140. The combination of the first and second contact openings form the "shared" contact opening 150 shown in FIG. 1.

If contact opening 150 is a single contact opening, then a single photolithography and etch operation can be used.

During the formation of contact opening 150, the top surface of S/D region 140 may be partially etched according to some embodiments. In some embodiments, and while the top surface of the S/D region is being etched, S/D material (e.g., SiGe) can be sputtered from the top surface of S/D region 140 and get "re-deposited" to the sidewall surfaces at the bottom of contact opening 150. The re-deposited SiGe layer is not shown in FIG. 1 for simplicity.

Figure 2:
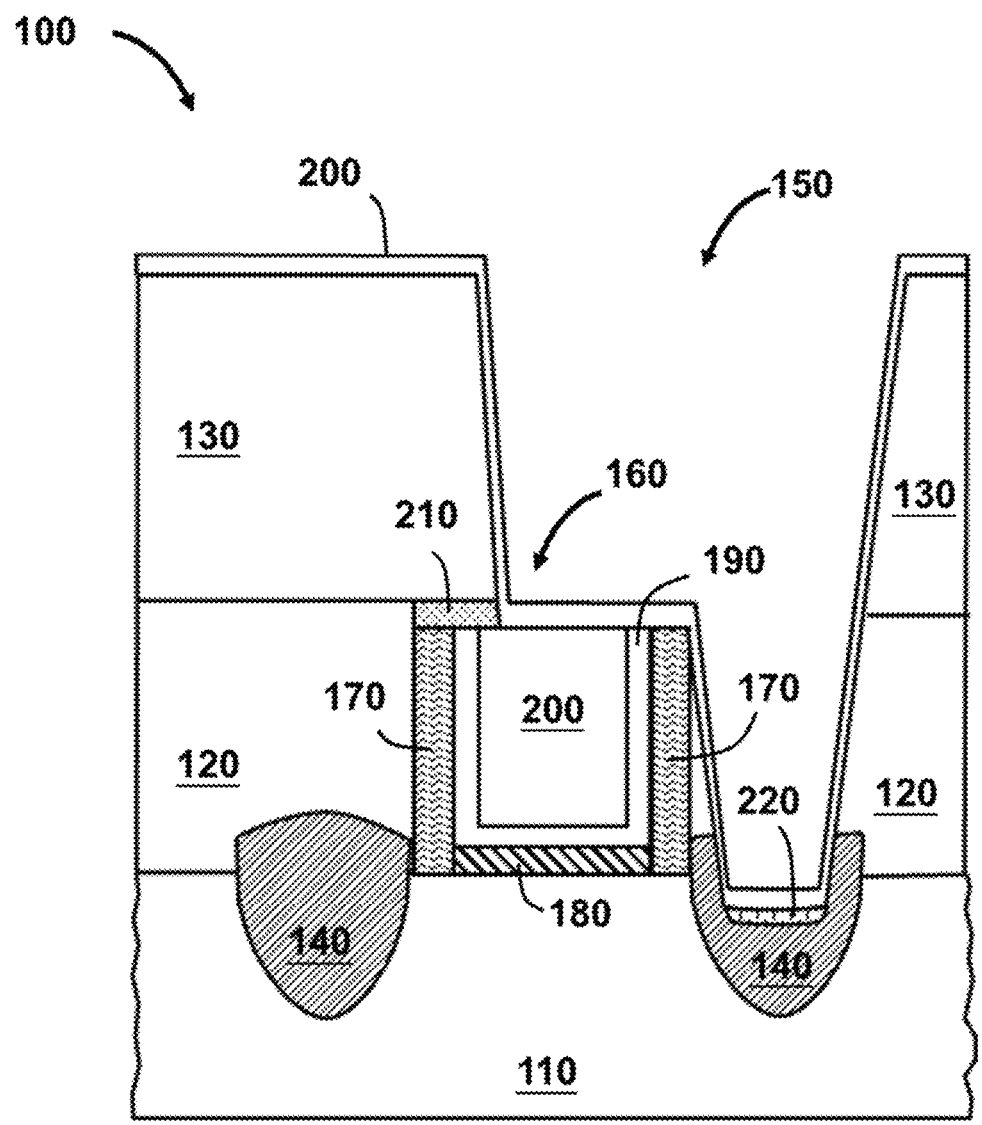
FIG. 2 is a cross-section of a contact opening after the deposition of a metal layer in the contact opening and the formation of an amorphous layer in a source/drain region in accordance with some embodiments.

FIG. 2 is a cross-section of structure 100 after the deposition of metal layer 200 in contact opening 150. Metal layer 200 covers the sidewall surfaces of contact opening 150 and the exposed surfaces of gate structure 160 and S/D region 140. By way of example and not limitation, metal layer 200 can be a titanium (Ti), a cobalt (Co), or a nickel (Ni) layer. In some embodiments, metal layer 200 is thicker at the bottom of contact opening 150 (e.g., on top of S/D region 140). In some embodiments, the thickness of metal layer 200 on the S/D SiGe region can range from about 8 to about 14 nm.

In some embodiments, metal layer 200 can "amorphize" the top surface of the epitaxially grown SiGe S/D region to form an amorphous layer 220 which can extend from about 3 nm to about 8 nm in the SiGe S/D region 140. In some embodiments, amorphous layer 220 may contain traces of metal layer 200 (Ti, Co, Ni), Si, and Ge.

In some embodiments, metal layer 200 can be deposited with a sputtering process such as physical vapor deposition (PVD). In some embodiments, the PVD process can include a radio frequency (RF) source and a direct current (DC) source which can provide RF energy and DC power to generate a plasma that would sputter material from a metal target. In some embodiments, the RF and DC power can range from about 100 kW to about 5000 kW. By way of example and not limitation, the metal target can be made of Ti, Co, Ni, or NiPt. In some embodiments, an impedance controller is used to adjust the bias voltage on the substrate (e.g., the wafer) during processing. The impedance controller has a variable capacitor tuning circuit so that the impedance's set point can be, for example, expressed as a percentage of the full scale of the capacitance of the variable capacitor in the variable capacitor tuning circuit. Since the substrate bias voltage can be modulated through the impedance set point of the impedance controller, there is a correlation between the substrate bias voltage and the percentage of the full scale of the capacitance of the variable capacitor in the variable capacitor tuning circuit. For example, a higher impedance "percentage" can correspond to a lower bias voltage value on the substrate and vice versa.

The metal, which is sputtered off the metal target, can be ionized before being deposited on the exposed surface of substrate 110. Therefore, impedance setting (substrate bias voltage) adjustments can modulate the metal ion energy at which the metal ions impinge on the exposed surfaces of substrate 110. This means that the substrate bias voltage can be used as a means to adjust the plasma and ion interaction with the substrate during processing. For example, a negative bias voltage on substrate 110 (e.g., high impedance percentage) can increase the impact energy of positively charged metal ions on the exposed surface of substrate 110. Therefore, the substrate bias voltage may modulate the depth at which the metal ions can penetrate in the exposed surface of SiGe S/D region 140.

According to some embodiments, energetic metal ions can penetrate SiGe S/D 140 surface and disrupt the symmetry of the epitaxial layer—thus forming amorphous layer 220. In some embodiments, the substrate bias voltage (impedance percentage) can modulate the thickness (depth) of amorphous layer 220. Since the mass of the metals (e.g., Ti, Co, Ni, or NiPt) that can be used for layer 200 can be different, amorphous layer formation 220 may require a different substrate bias voltage, or an impedance percentage setting, for each metal target. In some embodiments, the formation of an amorphous layer which extends from about 3 nm to about 8 nm into S/D region 140, and can suppress the formation of Ge-containing intrusions during silicidation, may require an impedance percentage between about 75% and about 95%. In some embodiments, the formation of amorphous layer 220 can occur concurrently with the metal sputtering process. In some embodiments, the impedance percentage during the metal sputtering process may increase, decrease, or remain constant.

According to some embodiments the pressure during deposition can range from about 40 mTorr to about 80 mTorr, the impedance setting can range from about 75% to about 95% (which can correspond to a substrate bias voltage between about 150 V to about 230 V for a given reactor geometry), and the process temperature can range from about 20° C. to about 100° C.

Figure 3:
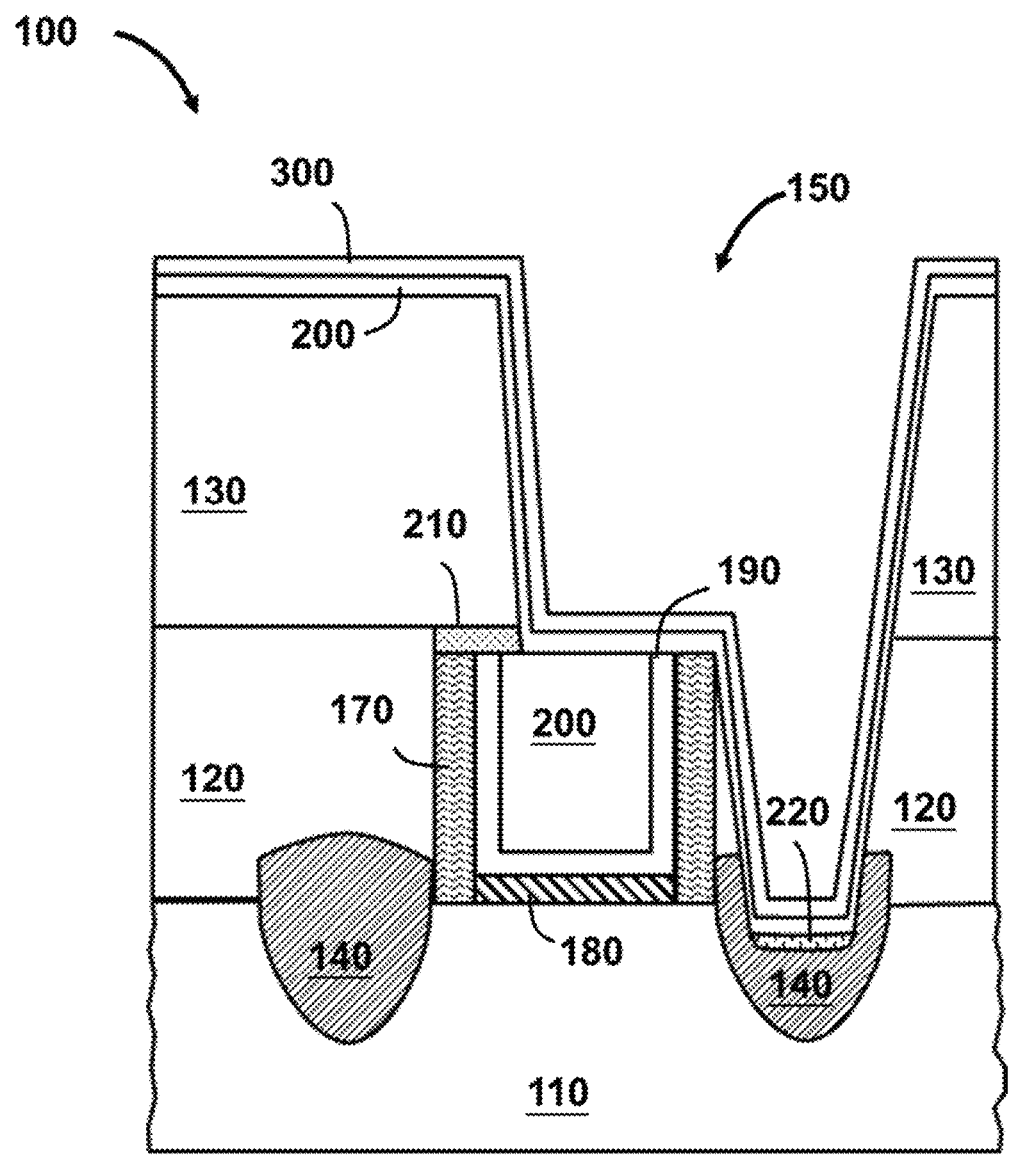
FIG. 3 is a cross-section of a contact opening after the deposition of a barrier metal layer in the contact opening in accordance with some embodiments.

FIG. 3 is a cross-sectional view of exemplary structure 100 after a conformal deposition of barrier metal layer 300 over metal layer 200. In some embodiments, barrier metal layer 300 is deposited after metal layer 200 without a "vacuum-break" (in-situ) to prevent, or limit, the oxidation of metal layer 200. By way of example and not limitation, barrier metal layer 300 can be deposited with chemical vapor deposition (CVD) or atomic layer deposition (ALD) at a thickness range between about 2 nm and about 4 nm. In some embodiments, the substrate temperature during the barrier metal layer deposition can range from about 350° C.

to about 500° C. In some embodiments, barrier metal layer 300 can be, for example, titanium nitride (TiN). Other deposition methods may be used to form metal layer 300, such as plasma-enhanced CVD (PECVD) or plasma-enhanced ALD (PEALD). Barrier metal layer 300 can protect metal layer 200 from subsequent processing, prevent silicide oxidation during the silicidation process, and function as an adhesion layer for any subsequent metal deposition.

Figure 4:
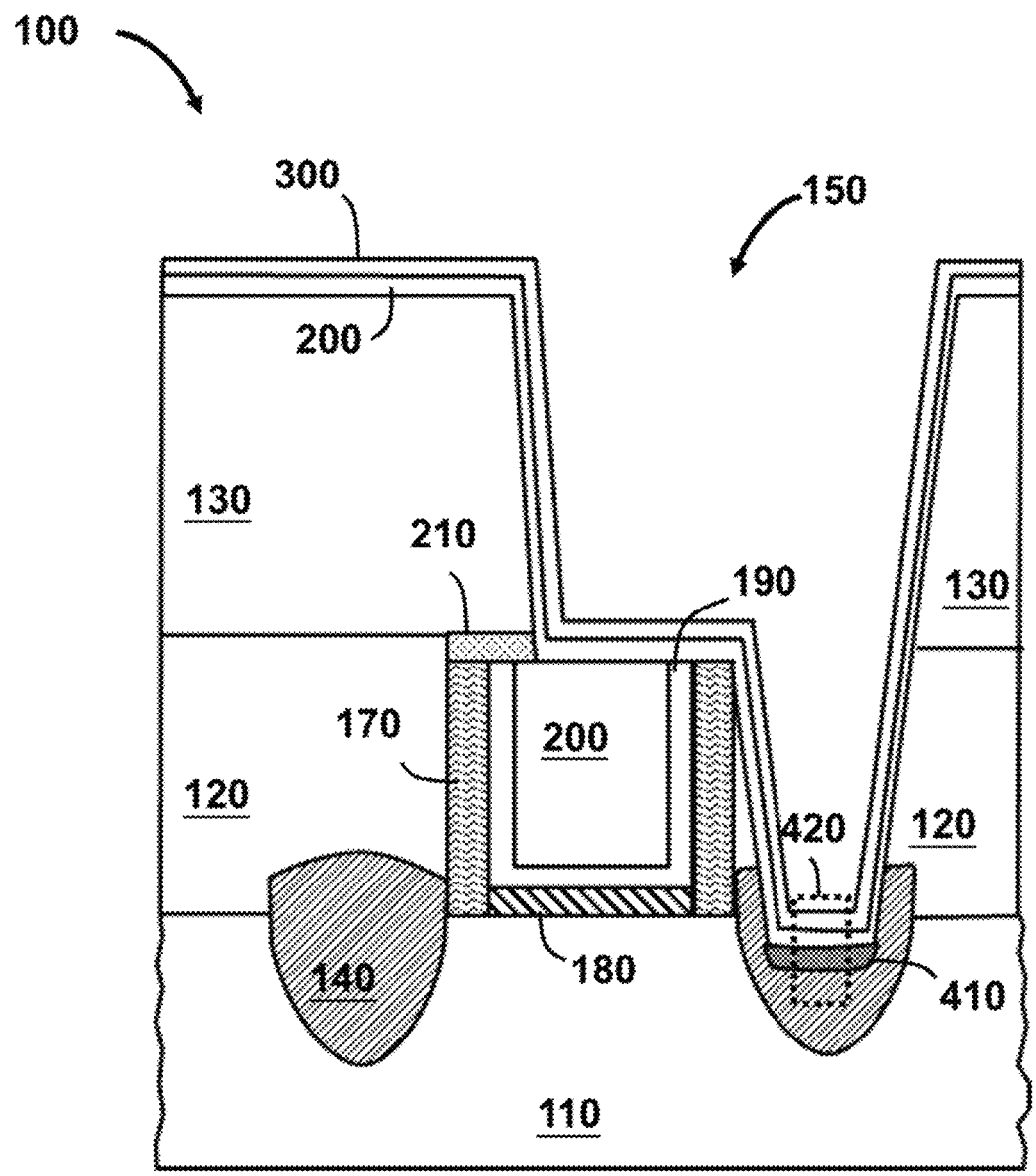
FIG. 4 is a cross-section of a contact opening after the formation of a silicide layer on the top surface of the source/drain region in accordance with some embodiments.

In some embodiments, structure 100 is subjected to a rapid thermal anneal (RTA) process so that metal layer 200 can react with silicon in the SiGe S/D region to form a silicide. In some embodiments, the annealing temperature depends on metal layer 200. For example, for Ti or Co metal layers, the annealing temperature can range from about 500° C. to about 600° C.; while for a NiPt metal layer, the annealing temperature can range from about 300° C. to about 500° C. The RTA process can last from about 30 s to about 200 s. In some embodiments, lamps are used in the RTA process. However, other annealing methods may be used (e.g., laser anneal). In some embodiments, a single RTA operation is sufficient to form the silicide layer. However, more than one RTA operations may be used. FIG. 4 shows structure 100 after an RTA process, where a silicide layer 410 is formed on the SiGe S/D region. In some embodiments, the thickness of silicide layer 410 can range from about 5 nm to about 15 nm.

Figure 5:
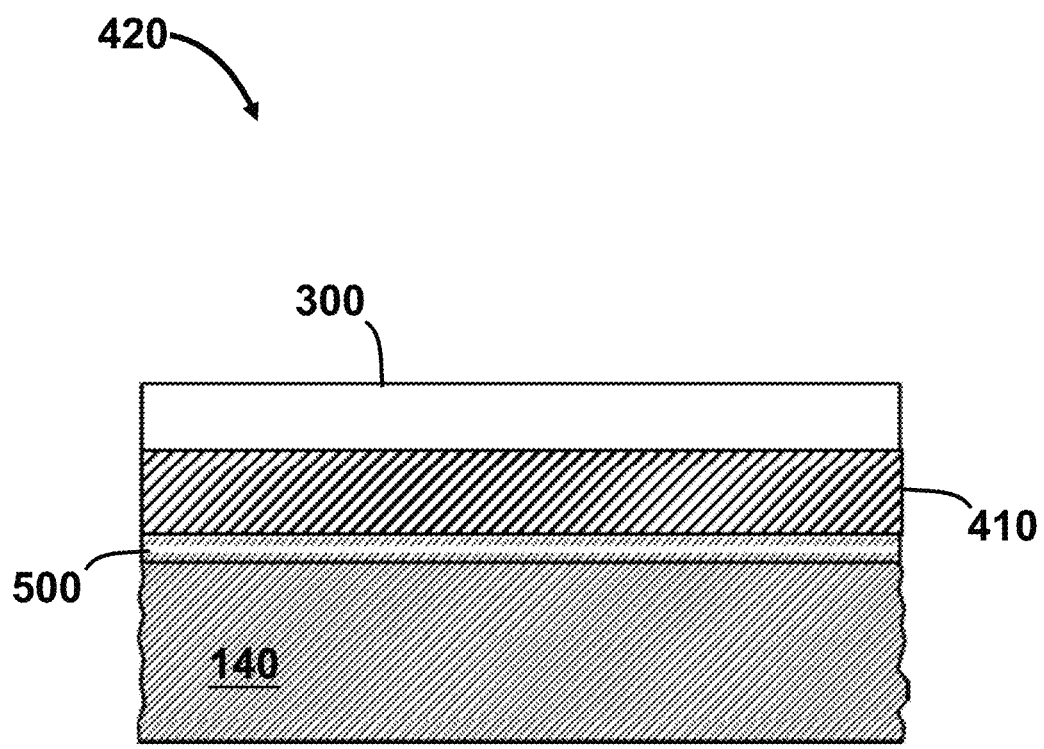
FIG. 5 is a cross-section of an interface between a barrier metal layer, a silicide, and a source/drain region in accordance with some embodiments.

FIG. 5 is a magnified view of area 420 of FIG. 4. In some embodiments, amorphous layer 220 can be "consumed" during the RTA operation since the metal of the amorphous layer can also react with silicon in SiGe S/D 140 to form silicide layer 410. In some embodiments, metal layer 200 on top of SiGe S/D region 140 is also "consumed" during the silicidation process. In some embodiments, an interfacial layer 500 may be formed between SiGe S/D region 140 and silicide 410. If metal layer 200 is, for example, a Ti layer, interfacial layer 500 may include a mixture of SiGe and titanium-germanium (TiGe). In some embodiments, interfacial layer 500 may be less than 1 nm (e.g., between 0 to about 0.5 nm). If metal layer 200 is, for example, a Ti layer, then the silicide layer may include Ti, Ge, and Si (TiSiGe). In some embodiments, interfacial layer 500 between epitaxial SiGe layer 140 and silicide layer 410, can be very thin (e.g., about a couple of atoms) and not easily distinguishable from a transmission electron microscope (TEM) image or micrograph.

Figure 6:
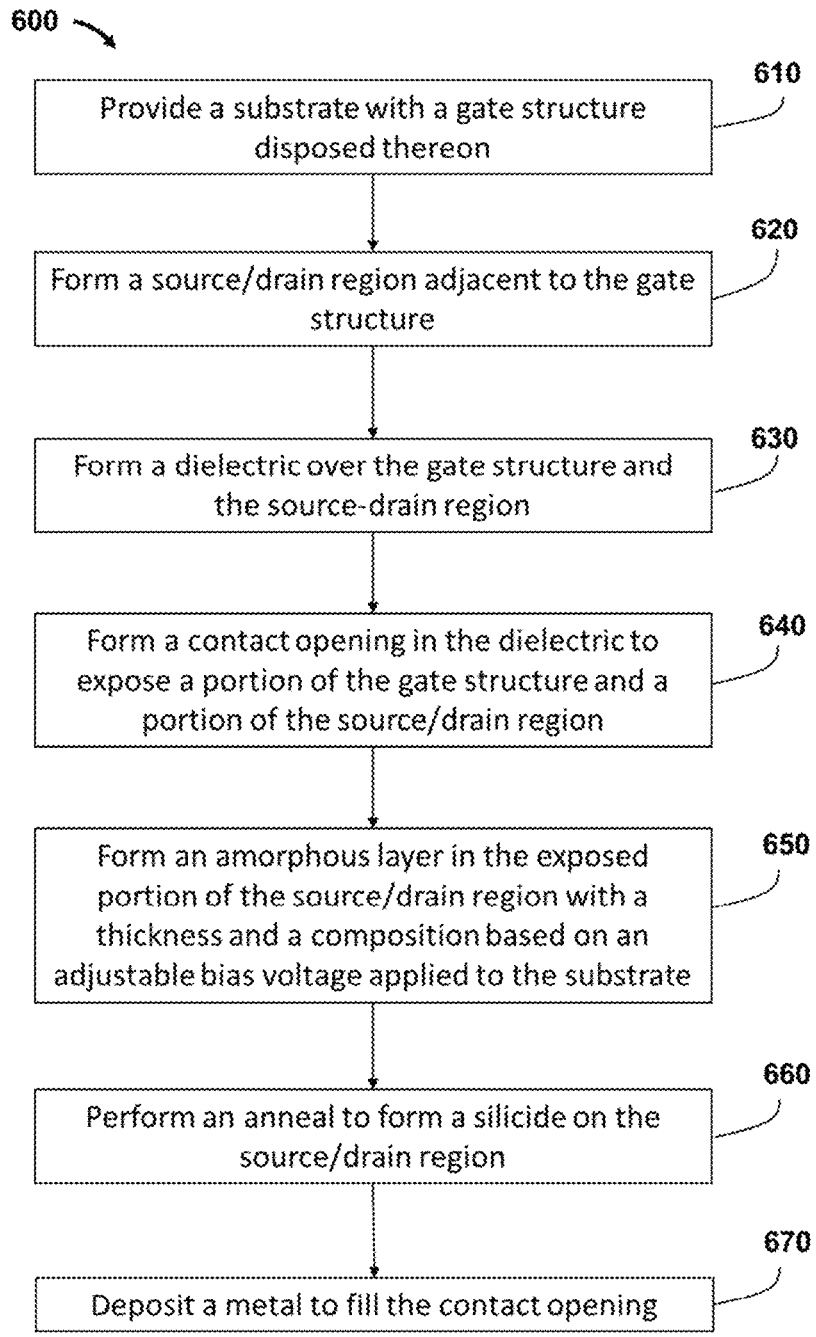
FIG. 6 is a flow diagram of an exemplary silicide fabrication method that forms an amorphous layer in the top surface of the source/drain region in accordance with some embodiments.

FIG. 6 is a flow chart of an exemplary silicide formation method 600 which forms an amorphous layer in the top surface of a SiGe S/D region to suppress the formation of Ge-containing intrusions during a silicidation process. Other fabrication operations may be performed between the various operations of exemplary silicide formation method 600 and may be omitted merely for clarity. This exemplary silicide formation method is not limited to method 600.

Method 600 starts with operation 610 where a substrate is provided with a gate structure disposed thereon. An exemplary gate structure 160 on an exemplary substrate 100 is shown in FIG. 1. In some embodiments, exemplary substrate 100 can be a bulk semiconductor wafer or the top layer of a SOI wafer. Alternatively, substrate 100 can be a fin (e.g., in the y-direction) that is perpendicular to the wafer's top surface. By way of example and not limitation, substrate 100 can be made of silicon or another elementary semiconductor such as, for example, germanium. Gate structure 160 can be a multilayer stack structure which may include an interfacial layer (IL) 180, a high-k dielectric 190, a multiple gate (MPG) metal stack 200, and a pair of opposing spacers 170.

IL 180 can be a native oxide, such as silicon oxide ($SiO_2$) with a thickness ranging from about 20 Å to about 30 Å. High-k dielectric 190 can be deposited by atomic layer deposition (ALD) and its thickness can range from about 10 Å to about 20 Å. In some embodiments, the high-k dielectric can be hafnium oxide ($HfO_2$), a hafnium silicate-based material, or another suitable dielectric material with k-value greater than 3.9—which is the dielectric constant of $SiO_2$ and is used as an example reference.

MPG metal stack 200 can include a capping layer for high-k dielectric 190, one or more metallic layers, a work function metal (WFM) stack and a metal fill layer. For simplicity, the capping layer, the one or more metallic layers, the work function metal (WFM) stack and the metal fill layer are not individually depicted within MPG metal stack 200 of FIG. 1. In some embodiments, the capping layer for high-k dielectric 190 can be deposited with ALD and a thickness range between about 5 Å and about 15 Å. As discussed above, the capping layer for high-k dielectric 190 can be used to protect high-k dielectric 190 from subsequent processing operations—e.g., the formation of the one or more metallic layers of MPG stack 200. In some embodiments, the capping layer for high-k dielectric 190 is a Ti-based material.

Exemplary metallic layers in MPG stack 200 may include a tantalum nitride (TaN) bottom layer and one or more titanium nitride (TiN) layers. In some embodiments, the TaN bottom layer is deposited with chemical vapor deposition (CVD). By way of example and not limitation, the thickness of the TaN bottom layer can range from about 10 Å to about 15 Å. In some embodiments, the one or more TiN layers can be formed with an ALD or a diffusion process. The TiN layers deposited with an ALD process can have a thickness between about 8 Å and about 12 Å, while the TiN layers deposited with a diffusion process can be thicker, e.g., with a thickness ranging from about 12 Å to about 50 Å.

In some embodiments, the WFM stack can include titanium/aluminum (Ti/Al) bi-layers or a Ti—Al alloy, both of which can be deposited with an ALD process. By way of example and not limitation, the WFM stack can have a thickness range between about 20 Å and about 35 Å. The WFM stack can adjust the work function of the metal gate electrode and influence the threshold voltage of the transistor. The thickness and the number of the one or more TiN layers, in combination with the WFM stack, can set the transistor's threshold voltage.

In some embodiments, metal fill layer can include a TiN barrier layer and a tungsten (W) metal stack. The TiN barrier layer, which can be deposited with an ALD process, can protect the underlying WFM stack from the fluorine chemistry used during the deposition of the W metal stack. According to some embodiments, the thickness of the TiN barrier layer can be between about 40 Å and about 50 Å. A nitride etch stop layer 210 is formed to protect MPG metal stack 200 during the formation of shared contact opening 150. In some embodiments, nitride etch stop layer 210 is $Si_xN_y$.

In some embodiments, spacers 170 can be made of a dielectric material, such as $SiO_2$, SiON, SiCN, $SiO_xC_y$, or $Si_xN_y$. In some embodiments, the thickness of spacers 170 can range from about 2 nm to about 5 nm. Spacers 170 can be a stack of one or more layers made of the same or different materials.

In operation 620, and referring to FIG. 1, source/drain regions 140 can be formed adjacent to gate structure 160. In some embodiments, spacers 170 can be used as alignment masks during the formation of the transistor's S/D regions 140. In some embodiments, S/D region 140 can be a p-type epitaxially grown SiGe stack. The SiGe stack may include two or more epitaxial layers which can be grown in succession and feature different Ge atomic % and B dopant concentrations. By way of example and not limitation, the first layer can have a Ge atomic % that ranges from 0 to about 40%, and a B dopant concentration that ranges from about $5 \times 10^9$ atoms/cm$^3$ to about $1 \times 10^{21}$ atoms/cm$^3$. The second epitaxial layer can have a Ge atomic % that ranges from about 20% to about 80%, and a B dopant concentration that ranges from about $3 \times 10^{20}$ atoms/cm$^3$ to about $5 \times 10^{21}$ atoms/cm$^3$. Finally, the third epitaxial layer is a capping layer that can have similar Ge atomic % and B dopant concentrations as the first layer (e.g., 0 to about 40% for Ge, and about $5 \times 10^{19}$ atoms/cm$^3$ to about $1 \times 10^{21}$ atoms/cm$^3$ for B dopant). The thickness of these layers can vary depending on the device performance requirements. For example, the first epitaxial layer can have a thickness range between about 10 nm and about 20 nm, the second epitaxial layer can have a thickness range between about 30 nm and about 60 nm, and the third epitaxial layer (capping layer) can have a thickness range between 0 nm and about 10 nm. In some embodiments, the SiGe epitaxial growth process can be performed at high temperatures ranging from about 450° C. to about 740° C.

In operation 630, a dielectric is disposed over the gate structure and the source/drain region. In some embodiment, the dielectric can be a stack of two or more dielectrics. For example, in FIG. 1, the dielectric is a stack of dielectrics 120 and 130. Dielectric 120 surrounds gate structure 160 and dielectric 130 is over dielectric 120 and gate stack 160. In some embodiments, dielectrics 120 and 130 can be made of $SiO_2$, $SiO_xC$, SiON, SiOCN, SiC, or SiCN. Dielectrics 120 and 130 can be deposited with CVD, flowable CVD, PVD, or can be thermally grown.

In operation 640, a contact opening is formed in the dielectric to expose a portion of the gate structure and a portion of the source/drain region. FIG. 1 shows an exemplary contact opening 150 according to the description of operation 640. In some embodiments, contact opening 150 can be a "shared" opening between gate stack 160 and one of the S/D regions 140. In some embodiments, contact opening 150 can be a contact opening that exposes S/D region 140 (e.g., that only exposes S/D region 140), e.g., a single contact. In the 3-dimensional space, contact opening 150 is a feature that can be considered a trench in dielectrics 130 and 140 along the x-axis.

Referring to FIG. 1, contact opening 150 can be formed by patterning dielectrics 120 and 130 with photolithography and etch processes. By way of example and not limitation, contact opening 150 can be formed in a single or a dual-operation process as discussed above. For instance, in a single-operation process a coat of photoresist can be applied on dielectric 130. The photoresist can be exposed and developed according to a desired pattern; for example, a desired pattern could be openings in dielectrics 130 and 120 to expose at least a portion of gate structure 160 and at least a portion of the S/D region 140. The unexposed areas of the photoresist can be stripped with a wet etch process to leave the desired pattern of developed photoresist on dielectric 130. A dry etch process can be used, for example, to remove exposed areas of dielectric 130. Areas of dielectric 130 covered by the developed photoresist can be protected from the etch chemistry of the dry etch process and therefore not etched. The etch process can be anisotropic so that the sidewalls of contact opening 150 can be substantially vertical, more than 80° (e.g., 87°). By way of example and not limitation, a dry etch chemistry can include a mixture of $CF_x$. Nitride etch stop capping layer 210 can protect gate structure 160 during the etch process and while dielectric 120 is being etched. The etch process may also etch part of spacer 170, however the selectivity towards dielectric 120 can be higher (e.g., greater than 5:1) and therefore dielectric 120 will be etched faster. The etch process may automatically stop when S/D region 140 is exposed.

Alternatively, a dual-step process may utilize two photolithography and two etch operations. For example, during the first operation, a first photolithography and a first etch operation can form a first contact opening that exposes a portion of gate structure 160; and a second photolithography and second etch operation can form a second contact opening that is partially shifted compared to the first opening and can expose a portion of S/D region 140. The combination of the first and second contact openings form the "shared" contact opening 150 shown in FIG. 1. If contact opening 150 is a single contact opening, then a single photolithography and etch operation may be used. In some embodiments, a wet etch chemistry can be used to remove polymer formation from the bottom and sidewall surfaces of contact opening 150 that may have been formed during the dry etch process.

Method 600 continues with operation 650 and the formation of an amorphous layer in the exposed portion of the source/drain region while a metal layer is being deposited via sputtering from a metal target. An adjustable bias voltage applied to the substrate (wafer) can modulate the thickness and composition of the amorphous layer. In some embodiments, the thickness of the amorphous layer can range from 3 to 8 nm.

FIG. 2 is a cross-section of structure 100 after the deposition of metal layer 200 in contact opening 150. Metal layer 200 covers the sidewall surfaces of contact opening 150 and the exposed surfaces of gate structure 160 and S/D region 140. By way of example and not limitation, metal layer 200 can be a Ti, Co, or Ni layer. In some embodiments, metal layer 200 is thicker at the bottom of contact opening 150 and thinner on sidewall surfaces of contact opening 150. In some embodiments, the thickness of metal layer 200 on the SiGe S/D region can range from about 8 nm to about 14 nm.

In some embodiments, metal layer 200 can be deposited with a sputtering process such as PVD. In some embodiments, the PVD process can include a RF source and a DC source which can provide RF energy and DC power to generate a plasma that would sputter material from a metal target. In some embodiments, the RF and DC power can range from about 100 kW to about 5000 kW. By way of example and not limitation, the metal target can be made of Ti, Co, Ni, or NiPt. In some embodiments, an impedance controller is used to adjust the bias voltage on the substrate (e.g., the wafer) during processing. The impedance controller has a variable capacitor tuning circuit so that the impedance's set point can be, for example, expressed as a percentage of the full scale of the capacitance of the variable capacitor in the variable capacitor tuning circuit. Therefore, there is a correlation between the substrate bias voltage and the percentage of the full scale of the capacitance of the variable capacitor in the variable capacitor tuning circuit. For example, a higher impedance "percentage" can correspond to a lower bias voltage value on the substrate and vice versa.

As discussed above, impedance setting (substrate bias voltage) adjustments can modulate the metal ion energy at which the metal ions impinge on the exposed surfaces of substrate 110. This means that the impedance setting can be used as a mean to adjust the plasma and ion interaction with the substrate during processing. For example, a negative bias voltage on substrate 110 (e.g., high impedance percentage) can increase the impact energy of positively charged metal ions on the exposed surface of substrate 110. Therefore, the substrate bias voltage may modulate the depth at which the metal ions can penetrate in the exposed surface of SiGe S/D region 140.

According to some embodiments, energetic metal ions can penetrate SiGe S/D 140 surface and disrupt the symmetry of the epitaxial layer—thus forming amorphous layer 220. In some embodiments, the substrate bias voltage (impedance percentage) can modulate the thickness (depth) of amorphous layer 220. Since the mass of the metals (e.g., Ti, Co, Ni, or NiPt) that can be used for layer 200 can be different, amorphous layer formation 220 may require a different substrate bias voltage, or an impedance percentage setting, for each metal target. In some embodiments, the formation of an amorphous layer which extends from about 3 nm to about 8 nm into S/D region 140, and can suppress the formation of Ge-containing intrusions during silicidation, may require an impedance percentage between about 75% and about 95%. In some embodiments, the formation of amorphous layer 220 can occur concurrently with the metal sputtering process. In some embodiments, the impedance percentage during the metal sputtering process may increase, decrease, or remain constant.

According to some embodiments the pressure during deposition can range from about 40 mTorr to about 80 mTorr, the impedance setting can range from about 75% to about 95% (which can correspond to a substrate bias voltage between about 150 Volts to about 230 Volts for a given reactor geometry), and the process temperature can range from about 20° C. to about 100° C.

After the deposition of metal layer 200 and the formation of amorphous layer 220, a barrier metal layer is conformally deposited over metal layer 200. For example, a barrier metal layer 300 is shown in FIG. 3. In some embodiments, barrier metal layer 300 is deposited after metal layer 200 without a vacuum break (in-situ). By way of example and not limitation, barrier metal layer 300 can be deposited with CVD or ALD at a thickness range from about 2 nm to about 4 nm. In some embodiments, the substrate temperature during the barrier metal layer deposition can be from about 350° C. to about 500° C.

In some embodiments, barrier metal layer 300 can be, for example, titanium nitride (TiN). Other deposition methods may be used to form metal layer 300, such as PECVD or PEALD. Barrier metal layer 300 can protect metal layer 200 from subsequent processing, prevent silicide oxidation during the silicidation process, and provide an adhesion layer for any subsequent metal deposition.

Method 600 continues with operation 660 where an anneal (e.g., RTA) can be used to form a silicide layer on the S/D region. During the anneal metal layer 200 can react with silicon in SiGe S/D region 140 to form a silicide. In some embodiments, the RTA temperature depends on metal layer 200. For example, for a Ti or Co metal layers, the RTA temperature can range from about 500° C. to about 600° C.; while for a NiPt metal layer, the RTA temperature can range from about 300° C. to about 500° C. The RTA process can last from about 30 s to about 200 s. In some embodiments, lamps are used in the RTA process. However, other annealing methods may be used (e.g., laser anneal). In some embodiments a single RTA operation is sufficient to form a silicide layer. However, a two-step RTAs may also be used. FIG. 4 shows structure 100 after the RTA process, where a silicide layer 410 is formed on the SiGe S/D region. In some embodiments, the thickness of silicide layer 410 can range from about 5 nm to about 15 nm.

FIG. 5 is a magnified view of area 420 of FIG. 4. In some embodiments, amorphous layer 220 can be "consumed" during the RTA operation since the metal of the amorphous layer can also react with silicon in SiGe S/D 140 to form silicide layer 410. In some embodiments, metal layer 200 on top of SiGe S/D region 140 is also "consumed" during the silicidation process. In some embodiments, an interfacial layer 500 may be formed between SiGe S/D region 140 and silicide 410. If metal layer 200 is, for example, a Ti layer, interfacial layer 500 may include a mixture of SiGe and titanium-germanium (TiGe). In some embodiments, interfacial layer 500 may be less than 1 nm (e.g., from 0 to about 0.5 nm). If metal layer 200 is, for example, a Ti layer, then the silicide layer may include Ti, Ge, and Si (TiSiGe). In some embodiments, interfacial layer 500 between epitaxial SiGe layer 140 and silicide layer 410, can be very thin and not distinguishable from a transmission electron microscope (TEM) image or micrograph.

Figure 7:
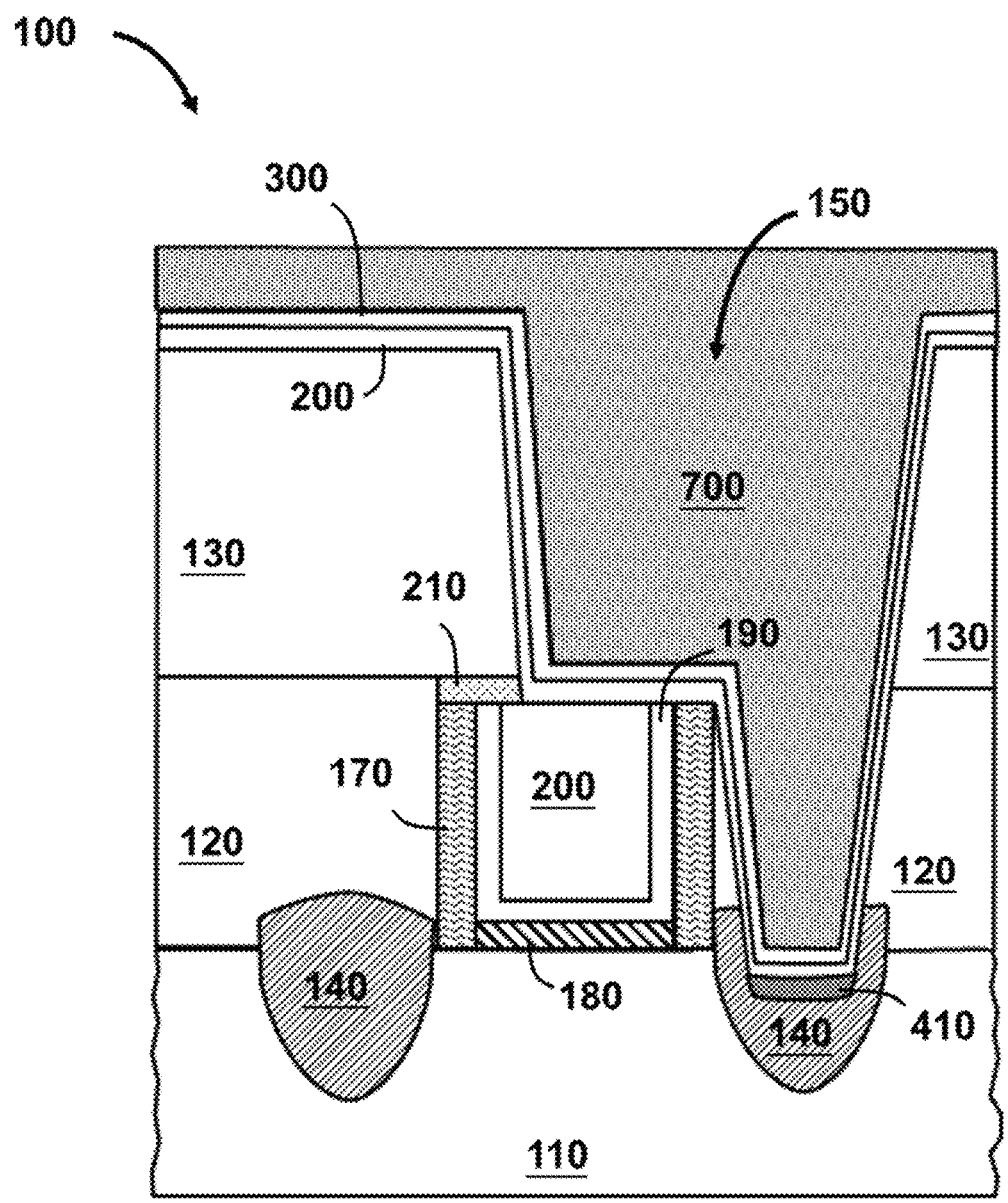
FIG. 7 is a cross-section of a contact in accordance with some embodiments.

In operation 670, a metal is deposited to fill the contact opening (e.g., contact opening 150). FIG. 7 is a cross-section of a contact opening 150 after the deposition of metal fill 700. In some embodiments, metal fill 700 can include a tungsten (W) metal stack which can be deposited in a two-step process, e.g., a thin layer is deposited first and a thick layer is deposited second. The first layer is conformally deposited with an ALD process and its thickness can range from about 2 to about 4 nm. The first layer is referred to as W nucleation. The second layer can be deposited with a CVD process, its thickness can range from about 130 nm to about 180 nm. The thick layer fills contact opening 150. The nucleation layer is not shown in FIG. 7 for simplicity. By way of example and not limitation, metal fill 700 may include other metals such as Co or aluminum (Al). These metals can be deposited with CVD, ALD, PVD, PECVD or PEALD. These metal option may require a different barrier metal 300.

A silicide formation process, which can form an amorphous layer in the SiGe S/D region via the application of a substrate bias voltage during a metal layer deposition, is disclosed to suppress the formation of a Ge-rich layer and Ge-containing protrusions during the silicidation process. The amorphous layer is formed during the metal deposition and prior to the silicide anneal. The thickness, or depth, of the amorphous layer can be modulated by the substrate bias voltage during the metal deposition. Therefore, the amorphous layer formation process can be performed in-situ with the metal layer deposition, and it does not require additional processing operations. Consequently, a very thin interface (e.g., a couple of atoms) between the silicide and the SiGe S/D region can be obtained.

In some embodiments, a method includes a substrate with a gate structure disposed thereon and a source/drain region adjacent to the gate structure. A dielectric is formed over the gate structure and the source-drain region and a contact opening is formed in the dielectric to expose a portion of the gate structure and a portion of the source/drain region. An amorphous layer is formed in the exposed portion of the source/drain region with a thickness which is based on an adjustable bias voltage applied to the substrate. Further, an anneal is performed to form a silicide on the source/drain region.

In some embodiments, a method includes a substrate with a source/drain region and a dielectric formed over the source/drain region. A contact opening is formed in the dielectric to expose a portion of the source/drain region. A metal-containing amorphous layer is formed in the exposed portion of the source/drain region, where a thickness of the metal-containing amorphous layer is based on a substrate bias voltage that is modulated by an adjustable impedance. An anneal is performed to form a silicide on the source/drain region.

In some embodiments, a semiconductor device includes a substrate with a fin which is disposed thereon. A source/drain region is formed on the fin and an interfacial layer on the source/drain region, where the thickness of the interfacial layer is based on an adjustable voltage that is applied to the substrate. A silicide layer is formed on the interfacial layer, and a barrier metal layer formed over the silicide. Further, a metal is formed over the barrier metal layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate with a gate structure disposed thereon;
   forming a source/drain region adjacent to the gate structure;
   forming a dielectric over the gate structure and the source/drain region;
   forming a contact opening in the dielectric to expose a portion of the gate structure and a portion of the source/drain region;
   depositing, in the contact opening, a metal layer to amorphize a top surface of the exposed portion of the source/drain region and form an amorphous layer between the deposited metal and the source drain region;
   depositing a barrier layer in the contact opening and on the metal layer; and
   performing an anneal to form a silicide from the metal layer, the amorphous layer, and a portion of the source/drain region.

2. The method of claim 1, wherein the depositing the metal layer comprises depositing a metal via sputtering at a process temperature between about 20° C. and about 100° C.

3. The method of claim 1, wherein the amorphous layer is formed by impinging metal ions on the top surface of the exposed portion of the source/drain region at a thickness between about 3 nm and about 8 nm.

4. The method of claim 3, wherein the thickness of the amorphous layer is based on an adjustable bias voltage applied to the substrate.

5. The method of claim 1, wherein the source/drain region comprises a silicon-germanium (Site) epitaxially-grown stack.

6. The method of claim 1, wherein the silicide comprises titanium with silicon and germanium, cobalt with silicon and germanium, nickel with silicon and germanium, or nickel platinum with silicon and germanium.

7. The method of claim 1, wherein the performing the anneal comprises performing a rapid thermal anneal process at a temperature between about 500° C. and about 600° C. with a duration of about 30 s to about 200 s.

8. The method of claim 1, wherein performing the anneal comprises consuming the amorphous layer.

9. A method, comprising:
   providing a substrate with a source/drain region comprising an epitaxial stack;
   forming a dielectric over the epitaxial stack;
   forming a contact opening in the dielectric to expose the epitaxial stack in the source/drain region; and
   forming a metal-containing amorphous layer in a top portion of the epitaxial stack, wherein forming the metal-containing amorphous layer comprises:
      generating metal ions from a metal target;
      accelerating the metal ions towards the epitaxial stack through the contact opening by adjusting a bias voltage applied to the substrate, wherein the accelerated metal ions penetrate the epitaxial stack and disrupt a crystalline structure of the top portion of the epitaxial stack to form the metal-containing amorphous layer
      and deposit a metal layer in the contact opening; and
      modulating a thickness of the metal-containing amorphous layer based on the bias voltage applied to the substrate; and
   after forming the metal-containing amorphous layer, performing an anneal to form a silicide from the metal layer and the metal-containing amorphous layer.

10. The method of claim 9, wherein prior to performing the annealing, depositing a liner layer in the contact opening.

11. The method of claim 9, wherein modulating the thickness of the metal-containing amorphous layer comprises adjusting a kinetic energy of the metal ions impinging the top layer of the epitaxial stack.

12. The method of claim 9, wherein modulating the thickness of the metal-containing amorphous layer comprises setting the thickness of the metal-containing amorphous layer between about 3 nm and about 8 nm.

13. The method of claim 9, wherein performing the anneal comprises consuming the metal-containing amorphous layer.

14. The method of claim 9, wherein the metal-containing amorphous layer comprises titanium with germanium and silicon, cobalt with germanium and silicon, nickel with germanium and silicon, or nickel platinum with germanium and silicon.

15. A method comprising:
   providing a substrate with a source/drain region comprising an epitaxial layer;
   depositing a dielectric layer over the source/drain region;
   etching the dielectric layer to form a contact opening in the dielectric layer to expose a portion of the source/drain region;
   depositing a metal layer in the contact opening to form an amorphous layer in a top surface of the epitaxial layer, wherein the amorphous layer is interposed between the deposited metal layer and the epitaxial layer and comprises a metal;

depositing a barrier layer over the metal layer; and after depositing the barrier layer, annealing the substrate to form a silicide between the barrier layer and the epitaxial layer, wherein the amorphous layer is consumed to form a portion of the silicide.

16. The method of claim 15, wherein depositing the metal layer comprises forming the amorphous layer with a thickness between about 3 nm and about 8 nm that is based on a substrate bias voltage modulated by an adjustable impedance setting that ranges from about 75% to about 95% of a full scale of a capacitance in a variable capacitor tuning circuit.

17. The method of claim 15, wherein the epitaxial layer comprises one or more boron-doped silicon germanium epitaxially grown layers with different boron and germanium concentrations.

18. The method of claim 15, wherein depositing the metal layer comprises depositing the metal layer with a physical vapor deposition process at a temperature between about 20° C. and about 100° C. and a process pressure between about 40 mTorr and about 80 mTorr.

19. The method of claim 15, wherein the metal in the amorphous layer and the metal layer comprises titanium, cobalt, nickel, or nickel platinum.

20. The method of claim 15, wherein annealing the substrate comprises annealing the substrate at a temperature between about 300° C. and about 600° C. for a time period between about 30 s and about 200 s.

* * * * *

UNITED STATES PATENT AND TRADEMARK OFFICE
CERTIFICATE OF CORRECTION

PATENT NO. : 10,763,338 B2
APPLICATION NO. : 15/690693
DATED : September 1, 2020
INVENTOR(S) : Wu et al.

Page 1 of 1

It is certified that error appears in the above-identified patent and that said Letters Patent is hereby corrected as shown below:

In the Specification

In Column 9, Line 8, please replace "$5 \times 10^9$" with -- $5 \times 10^{19}$ --, therefor.

In the Claims

In Column 14, Claim 5, Line 2, please replace "(Site)" with -- (SiGe) --, therefor.

Signed and Sealed this
Sixth Day of October, 2020

Andrei Iancu
*Director of the United States Patent and Trademark Office*